US006223321B1

(12) United States Patent
Nasu et al.

(10) Patent No.: US 6,223,321 B1
(45) Date of Patent: Apr. 24, 2001

(54) RECORDING/REPRODUCTION SYSTEM

(75) Inventors: Masahiro Nasu; Takayuki Sugawara, both of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/129,496

(22) Filed: Aug. 5, 1998

(30) Foreign Application Priority Data

Aug. 8, 1997 (JP) .................................................. 9-215299

(51) Int. Cl.[7] .................................................. G11B 20/18
(52) U.S. Cl. .................................................. 714/769
(58) Field of Search .................................. 714/755, 756, 714/769

(56) References Cited

U.S. PATENT DOCUMENTS 4,607,367 * 8/1986 Ive et al. ................................ 371/37
4,785,451 * 11/1988 Sako et al. ............................. 371/37
5,068,855 * 11/1991 Kashida et al. ..................... 371/37.4
5,687,182 * 11/1997 Shikakura .............................. 371/41
5,996,109 * 11/1999 Shikakura ............................ 714/774

FOREIGN PATENT DOCUMENTS 2-112033A 4/1990 (JP) .

* cited by examiner

*Primary Examiner*—Stephen M. Baker
(74) *Attorney, Agent, or Firm*—Brinks Hofer Gilson & Lione

(57) ABSTRACT

A recording/reproduction device includes a reading mechanism to read information data stored in a floppy disk and constituted by a plurality of byte data and first inspection data and second inspection data to detect an error of the information data. First and second calculation mechanism calculate a first and second syndrome value from the byte data and the first and second inspection data, respectively. First and second error correction mechanisms perform error correction for the information data on the basis of the first and second syndrome value, respectively. A computer includes the second error correction mechanism. Because the second error correction is not performed in the floppy disk drive, the capacity of a storage unit is decreased, a memory in the floppy disk drive can be considerably smaller than that of a conventional floppy disk drive, and the cost of the floppy disk drive can be reduced. In addition, since secondary correction is not performed in the floppy disk drive, an increase in data transfer rate from the floppy disk drive to the computer can be realized.

5 Claims, 4 Drawing Sheets

F
C2 SYNDROME CALCULATOR
4
C2 BUFFER
6-2
7
BUFFER
256 BYTES
10
HOST COMPUTER
1
5
SW
9
SW
STORAGE UNIT
11
12
8
BUFFER
256 BYTES
CONTROL CIRCUIT
2
CPU
13
1a
3
C1 CORRECTION UNIT
6-1
C1 BUFFER

F
HOST COMPUTER
10
STORAGE UNIT
11
12
CPU
13
CONTROL CIRCUIT
2
C2 BUFFER
6-2
SW
9
C2 SYNDROME CALCULATOR
4
BUFFER
7
256 BYTES
BUFFER
8
256 BYTES
C1 BUFFER
6-1
C1 CORRECTION UNIT
3
SW
5
1
1a

HOST COMPUTER
STORAGE UNIT
CPU
10
11
12
13
G
9
SW
7
BUFFER
8
BUFFER
5
SW
2
CONTROL CIRCUIT
6
BUFFER
3
C1 CORRECTION UNIT
1
1a 100
110
HOST COMPUTER
CONTROL CIRCUIT
102
105-2
C2 BUFFER
109
SW
104
C2 CORRECTION UNIT
105-1
C1 BUFFER
108
BUFFER
20 KB
107
BUFFER
20 KB
103
C1 CORRECTION UNIT
106
SW
101
101a

FIG. 4

INFORMATION DATA | INSPECTION DATA

| INFORMATION DATA | INSPECTION DATA |
| --- | --- |
| DATA 1 | C1 CORRECTION DATA |
| DATA 2 | C1 CORRECTION DATA |
| DATA 3 | C1 CORRECTION DATA |
| DATA 4 | C1 CORRECTION DATA |
| DATA 5 | C1 CORRECTION DATA |
| DATA 6 | C1 CORRECTION DATA |
| DATA 7 | C1 CORRECTION DATA |
| DATA 8 | C1 CORRECTION DATA |
| DATA 9 | C1 CORRECTION DATA |
| DATA 10 | C1 CORRECTION DATA |
| DATA 11 | C1 CORRECTION DATA |
| --- | --- |
| DATA 79 | C1 CORRECTION DATA |
| DATA 80 | C1 CORRECTION DATA |
| C2 CORRECTION DATA | C1 CORRECTION DATA |
| C2 CORRECTION DATA | C1 CORRECTION DATA |
| C2 CORRECTION DATA | C1 CORRECTION DATA |
| C2 CORRECTION DATA | C1 CORRECTION DATA |

INFORMATION DATA

INSPECTION DATA $A_1$ $A_2$ ........ $A_{256}$

RECORDING/REPRODUCTION SYSTEM

BACKGROUND OF THE INVENTION

1. Field of the Invention

The present invention relates to an error correcting process in a data reading operation of a recording/reproduction device such as a floppy disk drive.

2. Description of the Related Art

Data stored in a floppy disk serving as a storage medium may not be correctly read due to scratches in the floppy disk or a reading error in a device. For this reason, in data reading from the storage medium, an error correcting process for data is required.

In order to improve the reliability of the data stored in the floppy disk, the error correction in data reading has two or more stages.

A conventional floppy disk drive will be described below with reference to FIGS. 3 and 4. FIG. 3 is a block diagram showing a conventional floppy disk drive in which data is read from a floppy disk 101, error correction for the read data is performed, and the data subjected to the error correction is output to a host computer 110.

Here, for example, data correction of the first stage is defined as C1 correction, and data correction of the second stage is defined as C2 correction. For example, the C1 correction and the C2 correction will be described below on the assumption that "Reed-Solomon code" is used in each of the C1 correction and the C2 correction.

FIG. 4 shows a data storage format on a floppy disk. Referring to FIG. 4, for example, "data 1" to "data 80" are blocks (to be referred to as sectors hereinafter) of original data which are stored. Each block has a data capacity of 256 bytes.

"C1 correction data" paired with each of "data 1" to "data 80" is redundant data (to be referred to as inspection data hereinafter) for performing inspection for an error of original 256-byte data.

"C2 correction data" is inspection data for performing error correction to each of the sectors of "data 1" to "data 80" in units of bytes. More specifically, "C2 correction data" is inspection data for performing error correction corresponding to regions A1 to A256 obtained by dividing information data in each of the sectors of "data 1" to "data 80" in units of bytes.

In addition, "C1 correction data" also exists in "C2 correction data", and error correction form "C2 correction data" is performed in C1 correction.

For example, in FIG. 3, a control circuit 102 causes a reader 101 to read data from a floppy disk 101*a*. The data is stored in a buffer 107. At the same time, the control circuit 102 causes a C1 correction unit 103 to calculate a syndrome value of each sector to store the calculated syndrome value in a buffer 105-1.

Here, the syndrome value in C1 correction represents an addition result between an integration value of byte data in the sectors and corresponding "C1 correction data" and an addition result between an integration value obtained by weighting the bytes in the sectors and integrating the weighted bytes and corresponding C1 correction data. If syndrome value is "0", it is considered that no read error exists.

The C1 correction unit 103 performs error correction for data stored in the buffer 107 on the basis of the syndrome value stored in the buffer 105-1.

Upon completion of the calculation and correction of the syndrome value in the C1 correction, the control circuit 102 cancels "C1 correction data" because "C1 correction data" is unnecessary. The control circuit 102 transfers the information data and "C2 correction data" from the buffer 107 to a C2 correction circuit 104.

The C2 correction circuit 104 calculates syndrome values in the regions A1 to A256 to store the calculated syndrome values in a buffer 105-2.

Here, the syndrome value in C2 correction represents an addition result between an integration value of byte data in the regions and corresponding "C2 correction data" and an addition result between an integration value obtained by weighting the bytes in the sectors and integrating the weighted bytes and corresponding "C2 correction data". If syndrome value is "0", it is considered that no read error exists.

In error correction performed by the C1 correction unit 103, when the number of error bits in a sector to be corrected is larger than the number of error bits which can be maximally corrected as "C1 correction data", the C2 correction circuit 104 solves a predetermined equation on the basis of the syndrome value to correct error bits of the corresponding region of the regions A1 to A256.

Upon completion of the calculation of the syndrome value in the C2 correction, the control circuit 102 cancels "C2 correction data" because "C2 correction data is unnecessary.

The moment data transfer from the data reader 101 to the buffer 107 and an error correcting process are performed, the control circuit 102 forms a path between a buffer 108 and the host computer 110 by means of a switching circuit 109. As a result, error-corrected information data stored in the buffer 108 is transferred to the host computer 110.

However, the above floppy disk drive requires at least 20 k(kilo) byte×2=40 kbyte as the bytes of the buffers 107 and 108. In addition, since the C1 correction unit 103, the C2 correction circuit 104, and the buffer 105 are required, a conventional floppy disk drive 100 increases in circuit scale, and the cost cannot be easily reduced.

Furthermore, even if an error does not occur in data reading, upon completion of a loading operation, 20-kbyte information data is transferred to the host computer 110, a disadvantage being that the conventional floppy disk drive 100 requires a long time to read/transfer the information data.

SUMMARY OF THE INVENTION

The present invention has been made under the above background, and has as its object to provide a recording/reproduction system such as a floppy disk drive in which the costs can be reduced by reducing the memory capacity in the device such as a floppy disk, and a reading/transferring rate of the information data can be increased.

In order to achieve the above object, according to the present invention, a recording/reproduction system comprises: a recording/reproduction device including a reading mechanism to read information data stored in a floppy disk and constituted by a plurality of byte data and first inspection data and second inspection data to detect an error of the information data, a first calculation mechanism to calculate a first syndrome value from the byte data and the first inspection data, a first error correction mechanism to perform error correction for the information data on the basis of the first syndrome value, and a second calculation mechanism to calculate a second syndrome value from the byte data and the second inspection data; and a computer including a second error correction mechanism to perform error correction for the information data on the basis of the second syndrome value.

According to the present invention, a recording/reproduction system is characterized by comprising: a recording/reproduction device including a reading mechanism to read information data stored in a floppy disk and constituted by a plurality of byte data and first inspection data and second inspection data to detect an error of the information data, a first calculation mechanism to calculate a first syndrome value from the byte data and the first inspection data, and a first error correction mechanism to perform error correction for the information data on the basis of the first syndrome value; and a computer including a second calculation mechanism to calculate a second syndrome value from the byte data and the second inspection data, and a second error correction mechanism to perform error correction for the information data on the basis of the second syndrome value.

BRIEF DESCRIPTION OF THE DRAWINGS

FIG. 4 is a view showing a storage format of information data and inspection data on a floppy disk.

DESCRIPTION OF THE PREFERRED EMBODIMENTS

Figure 1:
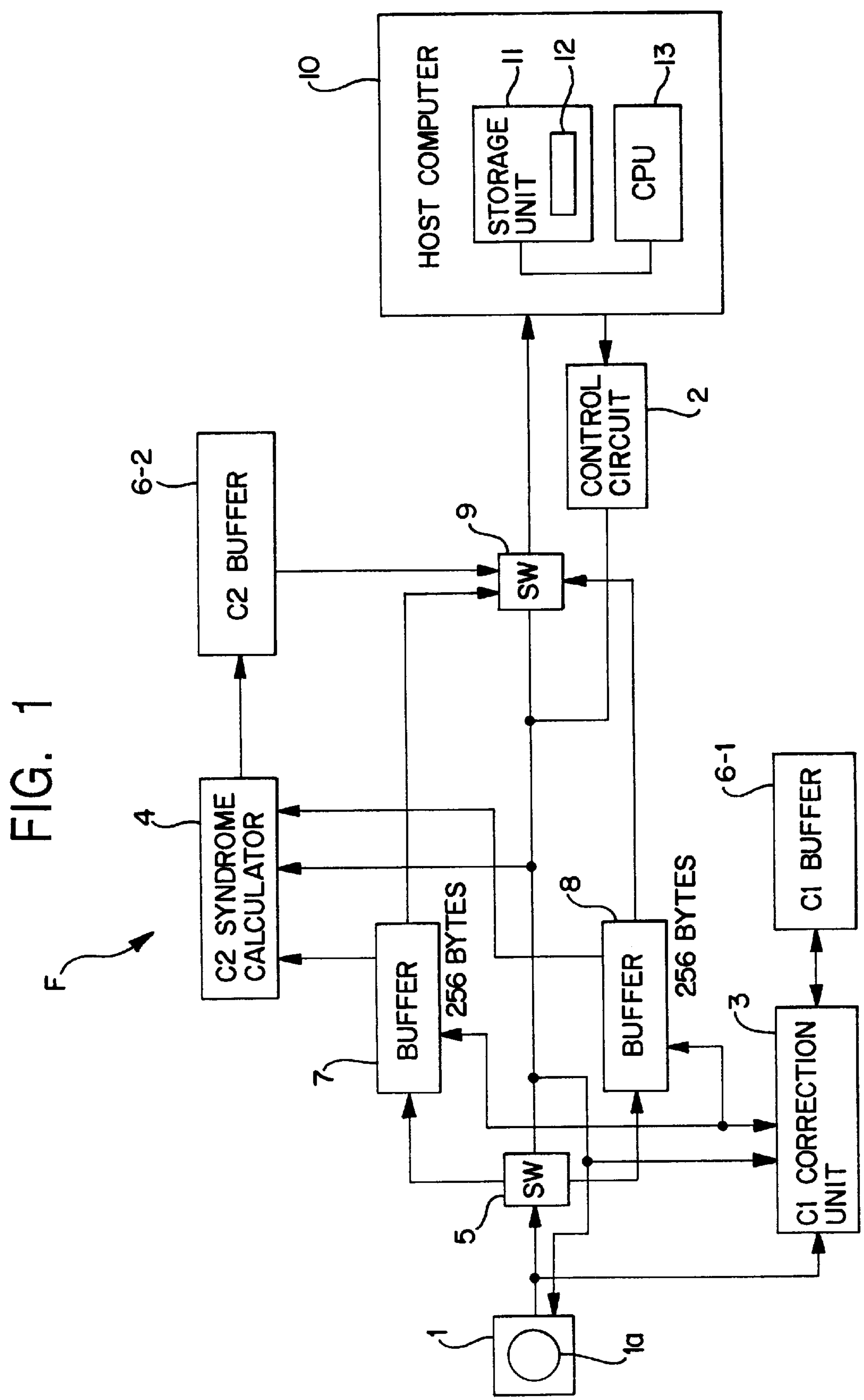
FIG. 1 is a block diagram showing the arrangement of a floppy disk system according to one embodiment of the present invention.

Embodiments of the present invention will be described below with reference to FIGS. 1 and 4. FIG. 1 is a block diagram showing the arrangement of a floppy disk system according to one embodiment of the present invention. Referring to FIG. 1, the floppy disk system includes a data reader 1 for the floppy disk. Information data and inspection data for performing error correction for the information data are stored in a floppy disk 1*a* (see FIG. 4). A controller 2 controls the processes of a switching circuit 5, a switching circuit 9, a C1 correction unit 3, and a C2 syndrome calculator 4.

The C1 correction unit 3 subtracts corresponding "C1 correction data" from an integration value (modular field summation) of byte data of information data in sectors supplied from the data reader and calculates a syndrome value B as a result. The C1 correction unit 3 calculates an integration value of weighted byte data of the information data in sectors supplied from the data reader 1. In addition, the C1 correction unit 3 subtracts corresponding "C1 correction data" from the calculated integration value, and calculates a syndrome value C as a result. The C1 correction unit 3 then writes the calculated syndrome value B and the calculated syndrome value C in a C1 buffer 6-1.

When one or both of the syndrome value B and the syndrome value C are not "0", the C1 correction unit 3 solves a predetermined equation on the basis of the syndrome value B and the syndrome value C to perform correction to an error bit of a corresponding sector of the corresponding "data 1" to "data 80" and "C2 correction data". More specifically, the predetermined equation is an equation constituted by an integration value of byte data of information data in sectors and "C1 correction data" whose value is "0" when "C1 correction data" is subtracted from the integration value of the byte data of the information data in the sectors. For example, with respect to the sector of "data 1", the predetermined equation is given by:

$$B_1=\text{"byte } 1_1\text{"}+\text{"byte } 1_2\text{"}+\ldots\text{"byte } 1_{256}\text{"}-P1=0$$

(P1=natural number). "Data 1" is constituted by 256 byte data of "byte $1_1$" to "byte $1_{256}$". The predetermined equation is an equation constituted by an integration value of weighted byte data of information data in sectors and "C1 correction data" whose value is "0" when "C1 correction data" is subtracted from the integration value of the weighted byte data of the information data in the sectors. For example, with respect to the sector of "data 1", the predetermined equation is given by:

$$C1=\alpha_1\cdot\text{"byte } 1_1\text{"}+\alpha_2\cdot\text{"byte } 1_2\text{"}+\ldots+\alpha_{256}\cdot\text{"byte } 1_{256}\text{"}-Q1=0$$

(Q1, $\alpha_1$ to $\alpha_{256}$=natural number).

As described above, the predetermined equation is set such that the syndrome value B and the syndrome value C are "0". Simultaneous equations for calculating the position of an error bit in a sector when one or both of the syndrome value B and the syndrome value C are not "0" are used as the predetermined equation.

The C2 syndrome calculator 4 adds the integration value of byte data of information data in the regions A1 to A256 of data supplied from the C1 correction unit 3 to corresponding "C2 correction data" to calculate a syndrome value D as a result. The C2 syndrome calculator 4 calculates an integration value of weighted byte data of the information data in the regions A1 to A256 of data supplied from the C1 correction unit 3. The C2 syndrome calculator 4 adds the calculated integration value to corresponding "C2 correction data" to calculate a syndrome value E as a result and then writes the calculated syndrome value D and the calculated syndrome value E in a C2 buffer 6-2.

More specifically, the predetermined equation is an equation constituted by an integration value of byte data of information data in regions and "C2 correction data" whose value is "0" when "C2 correction data" is subtracted from the integration value of the byte data of the information data in the regions. For example, with respect to the region "A1", the predetermined equation is given by:

$$D_1=\text{"byte } A1_1\text{"}+\text{"byte } A1_2\text{"}+\ldots+\text{"byte } A1_{80}\text{"}-PA1=0$$

(PA1=natural number). "Data 1" is constituted by 256 byte data of "byte $1_1$" to "byte $1_{256}$".

The predetermined equation is an equation constituted by an integration value of weighted byte data of information data in regions and "C2 correction data" whose value is "0" when "C2 correction data" is subtracted from the integration value of the weighted byte data of the information data in the regions. For example, with respect to the region "A1", the predetermined equation is given by:

$$E_1=\beta_1\cdot\text{"byte } 1_1\text{"}+\beta_2\cdot\text{"byte } 1_2\text{"}+\ldots+\beta_{80}\cdot\text{"byte } 1_{80}\text{"}-QA1=0$$

(QA1, $\beta_1$ to $\beta_{80}$=natural number).

As described above, the predetermined equation is set such that the syndrome value D and the syndrome value E are "0". Simultaneous equations for calculating the position of an error bit in a sector when one or both of the syndrome value D and the syndrome value E are not "0" are used as the predetermined equation.

The switching circuit 5 sets a path for data transfer between the data reader 1 and a buffer 7 or between the data reader 1 and a buffer 8 by a control signal from the control circuit 2.

The syndrome value B and the syndrome value C, which are calculated by the C1 correction unit 3, and the syndrome value D and the syndrome value E, which are calculated by the-C2 syndrome calculator 4, are stored in the C1 buffer 6-1 and the C2 buffer 6-2. The information data read from the floppy disk la by the data reader 1 is stored in the buffer 7. The information data read from the data reader 1 by the data reader 1 is also stored in the buffer 8.

The switching circuit 9 sets a path for data transfer between the buffer 7 and a host computer 10 and between the C2 buffer 6-2 and the host computer 10 by a control signal from the control circuit 2. In the host computer 10, a CPU (Central Processing Unit) 13 stores the transferred information data, the syndrome value D, and the syndrome value E in an input data region 12 of a storage unit 11. If the CPU 13 confirms that one or both of the transferred syndrome value D and the transferred syndrome value E are not "0", it is determined that error correction is not completely performed in C1 correction, and the CPU 13 performs error correction for the information data stored in the input data region 12 on the basis of the syndrome value D and the syndrome value E.

FIG. 4 shows a storage format of data on a floppy disk. Referring to FIG. 4, the sectors of "data 1" to "data 80" are blocks of original data (to be referred to as information data hereinafter) which are stored. Each block has a data capacity of 256 bytes. After "data" to "data 80", "C2 correction data" exists as a sector.

Here, "C1 correction data" paired with each of "data 1" to "data 80" is redundant data (to be referred to as inspection data hereinafter) for performing inspection for an error of original 256-byte data. "C2 correction data" has "C1 correction data" like the sectors of "data 1" to "data 80". "C2 correction data" is the above-described data for performing C2 correction for a corresponding region of the region A1 to the region A80 when C1 correction for "data 1" to "data 80" is not completely performed.

An operation of one embodiment will be described below with reference to FIGS. 1 and 4.

For example, referring to FIG. 1, according to a data request from the host computer 10, the control circuit 2 reads information data and inspection data stored in the floppy disk 1*a* by the data reader 1. The control circuit 2 transfers the read information data and inspection data to the buffer 7 and the C1 correction unit 3. The order of data transfer to the C1 correction unit 3 is: "data 1", "C1 correction data" of "data 1", "data 2", "C1 correction data" of "data 2" . . . "C2 correction data", and "C1 correction data" of "C2 correction data".

The C1 correction unit 3 sequentially receives the byte data of "data 1", and, at the same time, integrates the byte data of "data 1". As a result, when integration of 256 bytes of "data 1" is completed, the C1 correction unit 3 calculates a syndrome value B1 and a syndrome value C1 on the basis of the integration value and "C1 correction data" corresponding to "data 1". The C1 correction unit 3 stores the integration value of the calculated syndrome value B1 and the calculated syndrome value C1 in the C1 buffer 6-1.

The C1 correction unit 3 performs error correction for the sector of "data 1" stored in the buffer 7 on the basis of the syndrome value B1 and the syndrome value C1 which are stored in the C1 buffer 6-1. More specifically, when a syndrome value which is not "0" is detected as the syndrome value B1 and the syndrome value C1, the C1 correction unit 3 solves the simultaneous equations, which have been described above, to detect an error byte. The C1 correction unit 3 performs error correction for the detected error byte.

"C1 correction data" becomes unnecessary because the C1 correction unit 3 completes the C1 correction. For this reason, the control circuit 2 transfers only the information data of "data 1" from the buffer 7 to the C2 syndrome calculator 4.

The C2 syndrome calculator 4 integrates 256 bytes of "data 1" input from the C1 correction unit 3 in units of bytes. More specifically, the C2 syndrome calculator 4 calculates the value of "D1+byte All to overwrite the value on a syndrome value D1. Here, the initial value of the syndrome value D1 is "0". The C2 syndrome calculator 4 calculates the value of "D2+byte $A2_1$" to overwrite the value on the syndrome value D1. Here, the initial value of a syndrome value D2 is "0". Similarly, the C2 syndrome calculator 4 calculates syndrome values D3 to D256.

Similarly, the P2 syndrome calculator 4 calculates the value of "E1+β1·"byte $A1_1$"" to overwrite the value on a syndrome value E1. Here, the initial value of the syndrome value E1 is "0". The C2 syndrome calculator 4 calculates the value of "E2+β1·"byte $A2_1$"" to overwrite the value on a syndrome value E2. Here, the initial value of the syndrome value E2 is "0". Similarly, the C2 syndrome calculator 4 calculates syndrome values E3 to E256.

At this time, the control circuit 2 controls the switching circuit 9 to set a path for data transfer between the buffer 8 and the host computer 10 and to transfer the information data stored in the buffer 8 and subjected to error correction in the C1 correction to the host computer 10. The control-circuit 2 confirms that C1 correction for information data in the buffer 7 is completed and that information data in the buffer 8 is transferred to the host computer 10. As a result, the control circuit 2 controls the switching circuit 9 to set a path for data transmission between the buffer 7 and the host computer 10. The control circuit 2 begins to transfer the information data-subjected to C1 correction in the buffer 7 to the host computer 10. At the same time, the control circuit controls the switching circuit 5 to set a path for data transfer between the data reader 1 and the buffer 8.

The buffer 8 and the C1 correction unit 3 receive "data 2" and, at the same time, the C1 correction unit 3 integrates byte data of "data 2". As a result, upon completion of the integration of 256 bytes of "data 2", the C1 correction unit 3 calculates a syndrome value B2 and a syndrome value C2 by the integration value and "C1 correction data" corresponding to "data 2". The C1 correction unit 3 stores the integration value of the syndrome value B2 and the syndrome value C2 in the C1 buffer 6-1.

The C1 correction unit 3 performs error correction for the sector of "data 2" stored in the buffer 8 on the basis of the syndrome value B2 and the syndrome value C2 which are stored in the C1 buffer 6-1. More specifically, when a syndrome value which is not "0" is detected as the syndrome value B2 and the syndrome value C2, the C1 correction unit 3 solves the simultaneous equations which have been described above to detect an error byte. The C1 correction unit 3 performs error correction for the detected error byte.

Thus, "C1 correction data" becomes unnecessary because the C1 correction unit 3 completes the C1 correction. For this reason, the control circuit 2 transfers only the information data of "data 2" to the C2 syndrome calculator 4.

The C2 syndrome calculator 4 integrates 256 bytes of "data 2" input from the buffer 8 in units of bytes. More specifically, the C2 syndrome calculator 4 calculates the value of "D1+byte $A1_2$" to overwrite the value on a syndrome value D1. Here, the initial value of the syndrome value D1 is "byte $A1_1$". The C2 syndrome calculator 4 calculates the value of "D2+byte $A2_2$" to overwrite the value on the syndrome value D2. Here, the initial value of a syndrome value D2 is "byte $A2_1$". Similarly, the C2 syndrome calculator 4 calculates syndrome values D3 to D256.

Similarly, the C2 syndrome calculator 4 calculates the value of "E1+β2·"byte $A1_2$"" to overwrite the value on a syndrome value E1 Here, the initial value of the syndrome value E1 is "β1·"byte $A1_1$"". The C2 syndrome calculator 4 calculates the value of "E2+⊖2·"byte $A2_2$"" to overwrite the value on a syndrome value E2. Here, the initial value of the syndrome value E2 is "β1·"byte $A2_1$"". Similarly, the C2 syndrome calculator 4 calculates syndrome values E3 to E256. The C2 syndrome calculator 4 calculates syndrome values D (D={D1, D2 . . . D256}) and syndrome values E (E={E1, E2 . . . E256}) of bytes (see FIG. 4) of each of the region A1 to the region A256 of "data 2".

The control circuit 2 confirms that C2 syndrome calculation for information data in the buffer 8 is completed and that information data in the buffer 7 is transferred to the host computer 10. As a result, the control circuit 2 controls the switching circuit 9 to set a path for data transmission between the buffer 8 and the host computer 10. The control circuit 2 begins to transfer the information data subjected to C1 correction and C2 syndrome calculation in the buffer 8 to the host computer 10. At the same time, the control circuit controls the switching circuit 5 to set a path for data transfer between the C2 syndrome calculator 4 and the buffer 7.

The control circuit 2 repeats the above operations to complete C1 correction for all the byte data of "data 1" to "data 80". The control circuit 2 also performs C1 correction for "C2 correction data". The C2 syndrome calculator 4 calculates final syndrome values D (D={D1, D2 . . . D256}) and final syndrome values E (E={E1, E2 . . . E256}) on the basis of the "C2 correction data". The final C2 syndrome value is transferred to the host computer 10.

The control circuit 2 confirms that all the information data of "data 1" to "data 80" subjected to C1 correction and the data of the syndrome values D1 to D256 and the syndrome values E1 to E256 which are used for C2 correction are transferred to the host computer 10. At this time, since the control circuit 2 need not transfer "C2 correction data" to the host computer 10, the control circuit 2 transfers only the information data and the syndrome values D1 to D256 and the syndrome values E1 to E256 to the host computer 10.

In the host computer 10, the CPU 13 performs error correction for information data stored in the input data region 12 of the storage unit 11 in C2 correction on the basis of the syndrome value D and the syndrome value E.

More specifically, the CPU 13 starts error correction in C2 correction when all the sectors of "data 1" to "data 80", i.e., 20-kbyte information data, the syndrome values D1 to D256, and the syndrome values E1 to E256 are completely transferred to the input data region 12 of the storage unit 11.

When error correction is not completely performed in C1 correction, the CPU 13 detects values that are not "0" as the syndrome value D and the syndrome value E.

In this manner, the CPU 13 detects a byte having an error by the above simultaneous equations on the basis of the syndrome value D and the syndrome value E to perform error correction.

As described above, while the C1 correction unit performs C1 correction in units of sectors, when the control circuit 2 controls the switching circuit 5 and the switching circuit 9 to perform C1 correction in the buffer 7, the information data stored in the buffer 8 and subjected to C1 correction is transferred to the host computer 10.

In contrast to this, while the C1 correction unit performs C1 correction in units of sectors, when the control circuit 2 controls the switching circuit 5 and the switching circuit 9 to perform C1 correction in the buffer 8, the information data stored in the buffer 7 and subjected to C1 correction is transferred to the host computer 10.

For this reason, it is sufficient that the buffer 7 and the buffer 8 in the embodiment have capacities of 256 bytes and thus the memory in a floppy disk drive F can be considerably decreased compared to a conventional floppy disk drive. Therefore, the cost of the floppy disk drive can be reduced.

In addition, since C2 correction is not performed in the floppy disk drive, the embodiment can realize an increase in data transfer rate from the floppy disk drive to the host computer.

Although one embodiment of the present invention has been described above with reference to the accompanying drawings, the invention is not limited to this embodiment, and modifications of the present invention can be effected without departing from the spirit and scope of the invention.

For example, all the functions of the C2 syndrome calculator can be given to the host computer.

Figure 2:
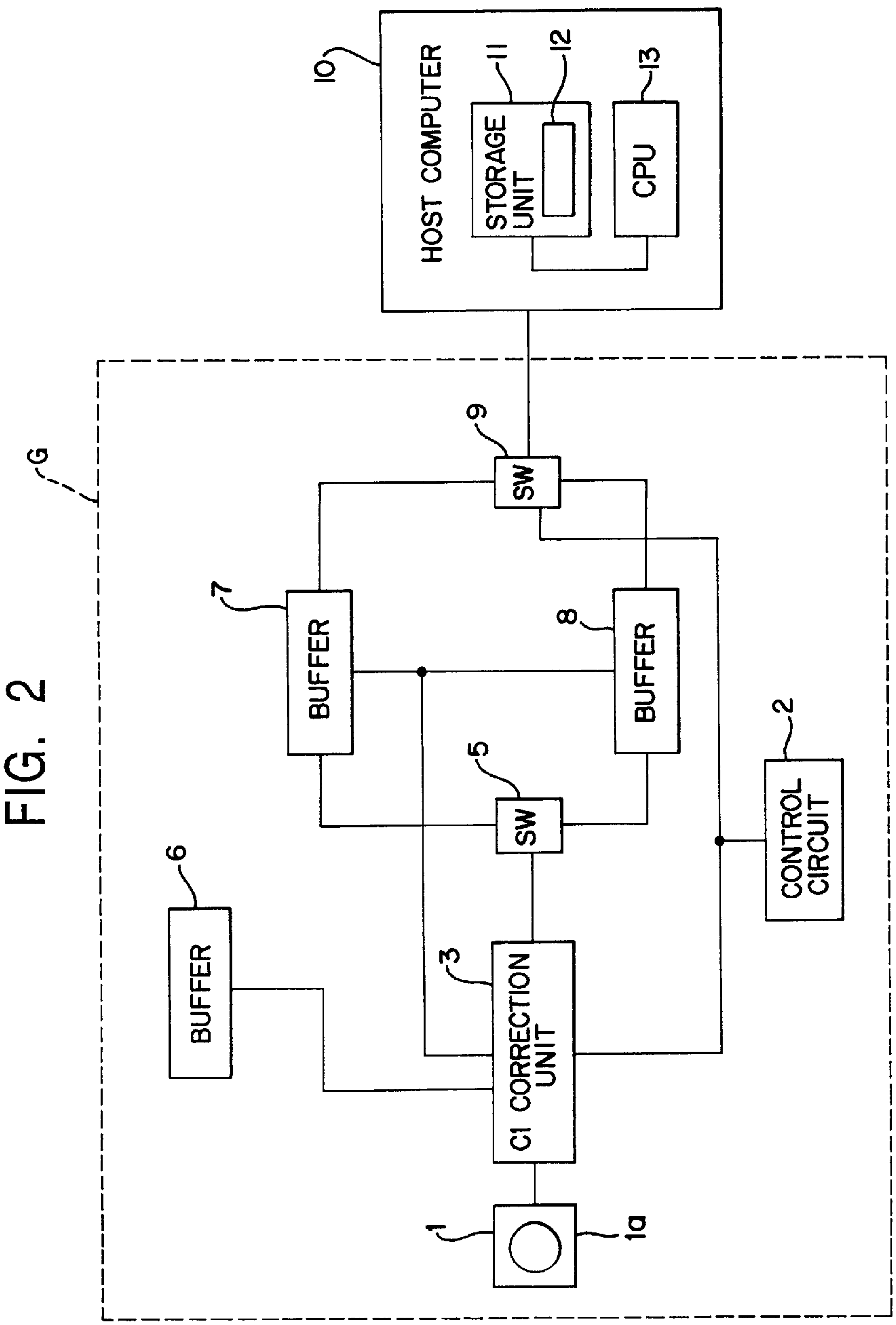
FIG. 2 is a block diagram showing the arrangement of a floppy disk system according to the second embodiment of the present invention.
Figure 3:
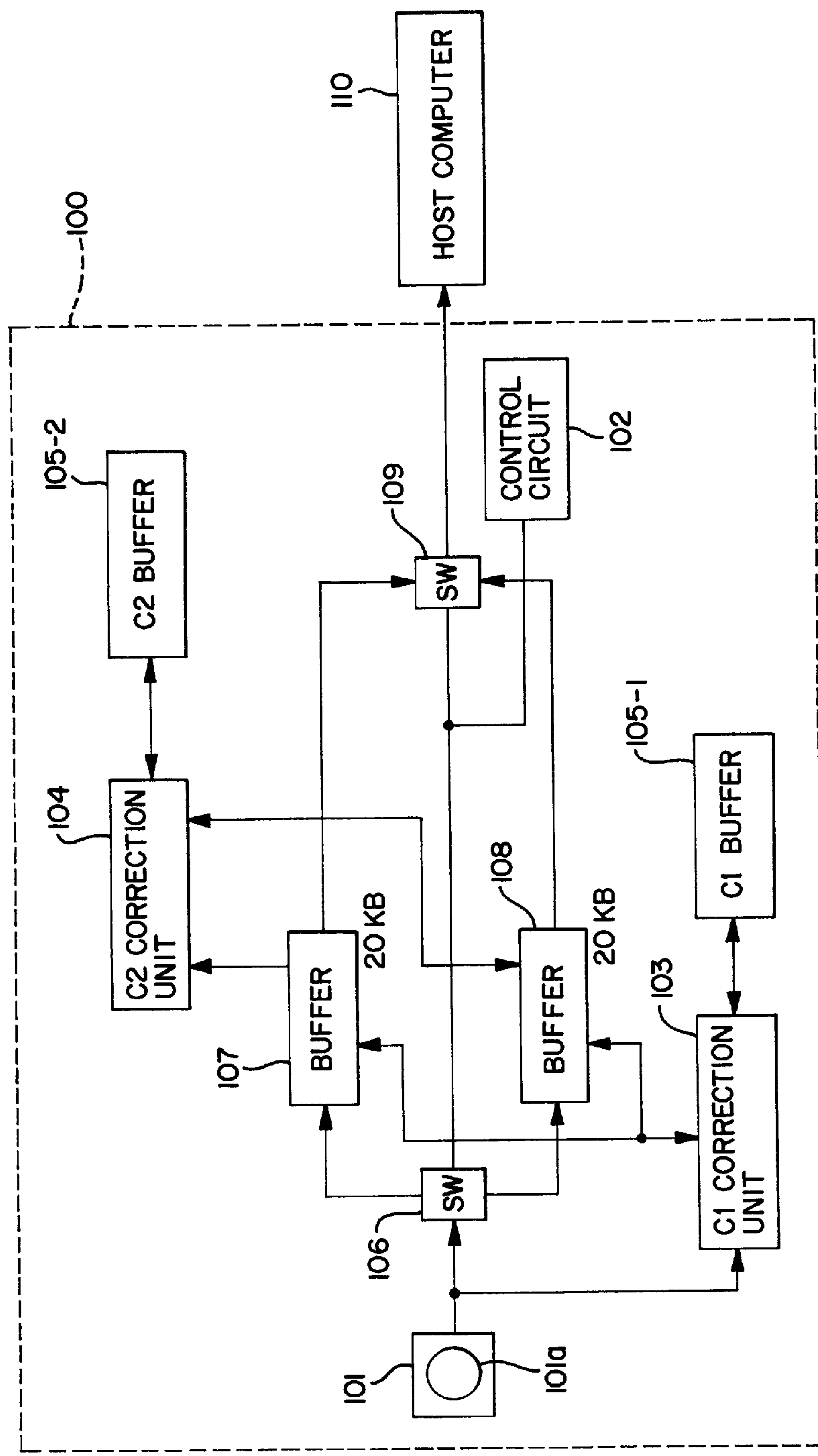
FIG. 3 is a block diagram showing the arrangement of a conventional floppy disk system.

FIG. 2 is a block diagram showing the arrangement of a floppy disk system according to the second embodiment of the present invention. The floppy disk system according to the second embodiment has the same arrangement as that the floppy disk system according to one embodiment except that the function of the C2 syndrome calculator 4 in FIG. 1 is given to the CPU 13 of the host computer 10.

More specifically, in a floppy disk drive G, only error correction in C1 correction is performed for information data read from a floppy disk 1*a*. A control circuit 2 transfers "C2 correction data" which is read from the floppy disk 1*a* and is not subjected to a process and information data subjected to C1 correction to a host computer 10.

In this manner, C2 correction for information data loaded on a storage unit 11 is performed by a CPU 13 as error correction including calculation of a syndrome value D and a syndrome value E in the host computer 10.

For this reason, a floppy disk drive in the floppy disk system according to the second embodiment does not require a circuit for C2 correction. As a result, since the floppy disk drive has a small circuit scale, the cost of the floppy disk drive can be reduced. In addition, since the floppy disk drive does not perform a process for C2 correction, a data transfer rate from the floppy disk drive to the host computer can be increased.

According to the present invention, a floppy disk system comprises: a floppy disk drive including a reading mechanism to read information data stored in a floppy disk and constituted by a plurality of byte data and first inspection data and second inspection data to detect an error of the information data, a first calculation mechanism to calculate a first syndrome value from the byte data and the first inspection data, a first error correction mechanism to perform error correction for the information data on the basis of the first syndrome value, and a second calculation mechanism to calculate a second syndrome value from the byte data and the second inspection data; and a computer including a second error correction mechanism to perform error correction for the information data on the basis of the second syndrome value. For this reason, since the second error correction is not performed in the floppy disk drive, a storage unit having an excessive capacity need not be included, a memory in the floppy disk drive can be considerably smaller than that of a conventional floppy disk drive, and the cost of the floppy disk drive can be reduced. Since C2 correction is not performed in the floppy disk drive, an increase in data transfer rate from the floppy disk drive to the computer can be advantageously realized.

According to the present invention, a floppy disk system comprises: a floppy disk drive including a reading mechanism to read information data stored in a floppy disk and constituted by a plurality of byte data and first inspection data and second inspection data to detect an error of the information data, a first calculation mechanism to calculate a first syndrome value from the byte data and the first inspection data, and a first error correction mechanism to perform error correction for the information data on the basis of the first syndrome value; and a computer including a second calculation mechanism to calculate a second syndrome value from the byte data and the second inspection data, and a second error correction mechanism to perform error correction for the information data on the basis of the second syndrome value. For this reason, a C2 correction circuit need not be included in the floppy disk drive, and the circuit scale of the floppy disk drive decreases. A reduction in cost can be realized, and a C2 correction process is not performed by the floppy disk drive. Therefore, an increase in data transfer rate from the floppy disk drive to the host computer can be advantageously realized.

Furthermore, according to the present invention, the second inspection data has first inspection data, and error correction is performed by the first error correction mechanism. For this reason, the reliability of the second inspection data can be improved.

What is claimed is:

1. A recording/reproduction system comprising:

a recording/reproduction device including:

read mechanism to read information data stored in a recording medium and constituted by a plurality of byte data and by first inspection data and second inspection data for detecting an error of the information data, a first calculation mechanism to calculate a first syndrome value from the byte data and the first inspection data, a first error correction mechanism to perform error correction for the information data on the basis of the first syndrome value, and a second calculation mechanism to calculate a second syndrome value from the byte data and the second inspection data stored in the data recording/reproduction device; and a second error correction mechanism to perform error correction for the information data on the basis of the second syndrome value sent from the data recording/reproduction device, said second error correction mechanism being built in a computer.

2. A recording/reproduction system comprising:

a recording/reproduction device including:

a read mechanism to read information data stored in a recording medium and constituted by a plurality of byte data and by first inspection data and second inspection data for detecting an error of the information data, a first calculation mechanism to calculate a first syndrome value from the byte data and the first inspection data, and a first error correction mechanism to perform error correction for the information data on the basis of the first syndrome value; and a second calculation mechanism to calculate a second syndrome value from the byte data and the second inspection data stored in the data recording/reproduction device, said second calculation mechanism being built in a computer, and a second error correction mechanism to perform error correction for the information data on the basis of the second syndrome values, said second error correction mechanism being built in the computer.

3. A recording/reproduction system according to claim 1, wherein the second inspection data has first inspection data.

4. A recording/reproduction system according to claim 1, wherein said first error correction mechanism performs error correction by using a Reed-Solomon code.

5. A recording/reproduction system according to claim 1, wherein said second error correction mechanism performs error correction by using a Reed-Solomon code.

* * * * *